(12) United States Patent
Galbi et al.

(10) Patent No.: US 8,176,458 B2
(45) Date of Patent: *May 8, 2012

(54) INCREASED EFFECTIVE FLIP-FLOP DENSITY IN A STRUCTURED ASIC

(75) Inventors: David Galbi, Fremont, CA (US); Eric T. West, San Jose, CA (US)

(73) Assignee: Otrsotech, Limited Liability Company, Wilmington, DE (US)

( * ) Notice: Subject to any disclaimer, the term of this patent is extended or adjusted under 35 U.S.C. 154(b) by 568 days.

This patent is subject to a terminal disclaimer.

(21) Appl. No.: 12/325,629

(22) Filed: Dec. 1, 2008

(65) Prior Publication Data

US 2009/0293035 A1     Nov. 26, 2009

Related U.S. Application Data

(63) Continuation of application No. 11/456,219, filed on Jul. 10, 2006, now Pat. No. 7,461,365.

(60) Provisional application No. 60/697,918, filed on Jul. 9, 2005, provisional application No. 60/705,937, filed on Aug. 5, 2005.

(51) Int. Cl.
    *G06F 17/50* (2006.01)
(52) U.S. Cl. .................... 716/132; 716/118; 716/135
(58) Field of Classification Search .................. 716/100, 716/101, 104, 118, 121, 132, 138, 135
    See application file for complete search history.

(56) References Cited

U.S. PATENT DOCUMENTS

| | | | |
|---|---|---|---|
| 3,832,686 A | 8/1974 | Bilgutay | |
| 5,166,604 A | 11/1992 | Ahanin et al. | |
| 5,252,917 A | 10/1993 | Kadowaki | |
| 5,337,285 A | 8/1994 | Ware et al. | |
| 5,537,068 A | 7/1996 | Konno | |
| 5,867,446 A | 2/1999 | Konishi et al. | |
| 5,883,534 A | 3/1999 | Kondoh et al. | |
| 5,889,828 A | 3/1999 | Miyashita et al. | |
| 5,901,101 A | 5/1999 | Suzuki et al. | |
| 6,125,217 A | 9/2000 | Paniccia et al. | |
| 6,166,990 A | 12/2000 | Ooishi et al. | |

(Continued)

FOREIGN PATENT DOCUMENTS

JP      63-300528      12/1988

(Continued)

OTHER PUBLICATIONS

Naveed A. Sherwani, Algorithms for VLSI Physical Design Automation, Third Edition, Springer, pp. 417-429, Nov. 30, 1998.

(Continued)

*Primary Examiner* — Sun Lin
(74) *Attorney, Agent, or Firm* — Schwabe, Williamson & Wyatt, P.C.

(57) ABSTRACT

An H-tree is formed in a conducting layer over a base array of a structured ASIC, the H-tree being a predefined constraint imposed on ad hoc circuit designs adapted to make use of a base array and H-tree. The endpoints of an H-tree can be formed at or near sequential elements. When an H-tree is used as part of a clock structure, clock skew to sequential elements and consumption of routing resources for forming a clock structure can be minimized. When a pulse generator is coupled to an H-tree, at least one flip-flop of a plurality of flip-flops can be emulated with an individual latch, thereby increasing effective flip-flop density.

24 Claims, 9 Drawing Sheets

U.S. PATENT DOCUMENTS

| | | | |
|---|---|---|---|
| 6,175,526 | B1 | 1/2001 | Morgan |
| 6,223,313 | B1 | 4/2001 | How et al. |
| 6,260,175 | B1 | 7/2001 | Basel |
| 6,305,001 | B1 | 10/2001 | Graef |
| 6,324,118 | B1 | 11/2001 | Ooishi |
| 6,393,592 | B1 | 5/2002 | Peeters et al. |
| 6,611,932 | B2 | 8/2003 | How et al. |
| 6,701,507 | B1 | 3/2004 | Srinivasan |
| 7,078,928 | B2 | 7/2006 | Sahara et al. |
| 7,313,739 | B2 | 12/2007 | Menon et al. |
| 2002/0157066 | A1 | 10/2002 | Marshall et al. |
| 2004/0015803 | A1 | 1/2004 | Huang et al. |
| 2004/0041610 | A1 | 3/2004 | Kundu |
| 2005/0055615 | A1 | 3/2005 | Agashe et al. |
| 2006/0085709 | A1 | 4/2006 | Kim et al. |
| 2006/0139056 | A1 | 6/2006 | Madurawe |

FOREIGN PATENT DOCUMENTS

| | | |
|---|---|---|
| JP | 04-072583 | 6/1992 |
| JP | 05-341016 | 12/1993 |
| JP | 11-317429 | 11/1999 |
| JP | 2000-209074 | 7/2000 |
| JP | 2001-059856 | 6/2001 |
| JP | 2003-503791 | 1/2003 |
| JP | 2003-043114 | 2/2003 |
| JP | PCT/JP2004/010089 | 7/2004 |
| KR | 1020050051856 A | 6/2005 |

OTHER PUBLICATIONS

Ex Parte Quayle Action for U.S. Appl. No. 11/456,219 dated Mar. 18, 2008.

Response to Ex Parte Quayle for U.S. Appl. No. 11/456,219 dated May 28, 2008.

Notice of Allowance for U.S. Appl. No. 11/456,219 dated Aug. 1, 2008.

Notice of Rejection for JP Application No. 2009-514561, mailed on Sep. 30, 2011.

Notice of Allowance mailed Oct. 4, 2011 from U.S. Appl. No. 12/303,938.

International Search Report from PCT/US07/070821 mailed Nov. 7, 2007.

Non-Final Office Action mailed Jan. 18, 2001 from U.S. Appl. No. 12/303,938.

European Search Report issued Apr. 19, 2011 from EP Application No. EP07798355.9.

M. Sachdev, "Testing defects in scan chains," IEEE Design & Test of Computers, vol. 12, Issue 4, pp. 45-51, 1995, See p. 48 Transparent Scan (including Figure 6-8).

Final Rejection issued Feb. 24, 2012 in JP Application No. 2009-514561.

— Fixed metal layer
● Pin to upper metal layer

INCREASED EFFECTIVE FLIP-FLOP DENSITY IN A STRUCTURED ASIC

CROSS REFERENCE TO RELATED APPLICATIONS

The present application is a continuation application of, and claims priority to U.S. Ser. No. 11/456,219, filed on Jul. 10, 2006, now U.S. Pat. No. 7,461,365, entitled "Increased Effective Flip Flop Density in a Structured ASIC;" which claims priority to U.S. Provisional Patent Application Ser. No. 60/697,918, filed Jul. 9, 2005, entitled "Method and Apparatus for Increasing Flip-Flop Density in a Structured ASIC;" and U.S. Provisional Patent Application Ser. No. 60/705,937, filed Aug. 5, 2005, entitled "Increased Flip-Flop Density in a Structured ASIC," all of which are hereby incorporated by reference which are hereby incorporated by reference in their entireties for all purposes except for those sections, if any, that are inconsistent with this specification.

BACKGROUND

1. Field

Advancements in integrated circuit design, including device density and clock skew in a Computer Aided Design (CAD) context, are needed to provide improvements in performance, efficiency, and utility of use.

2. Related Art

Unless expressly identified as being publicly or well known, mention herein of techniques and concepts, including for context, definitions, or comparison purposes, should not be construed as an admission that such techniques and concepts are previously publicly known or otherwise part of the prior art. All references cited herein (if any), including patents, patent applications, and publications, are hereby incorporated by reference in their entireties, whether specifically incorporated or not, for all purposes. Nothing herein is to be construed as an admission that any of the references are pertinent prior art, nor does it constitute any admission as to the contents or date of actual publication of these documents.

Use of ASICs (application specific integrated circuits) has become widespread in the semiconductor industry as giving circuit design engineers a relatively high amount of functionality in a relatively small package. In particular, ASICs are customizable integrated circuits that are customized in part to implement a circuit specified by a design engineer. The term "ASIC" actually refers to a variety of integrated circuit (IC) styles that vary in degree of customizability, including standard cells, gate arrays, structured ASICs, and FPGAs. As a general rule, the more customization that is required, the more expensive the ASIC will be and the longer the ASIC will take to fabricate.

In forming ASICs generally, several layers will be required. FIG. 1 shows a partial cross-sectional view of a generic integrated circuit. First, active layers 110 are formed on semiconductor substrate. The active layers 110 include devices such as transistors and diodes. Many active layer devices are formed independently of one another, i.e., they are not yet connected to other devices. Thus, once active layers 110 are formed, additional conducting layers, which are often composed of a metal such as aluminum or copper, are formed over the active layers to further interconnect the devices. Several conducting layers may be required to completely interconnect the devices to form a useful circuit. Four conducting layers, M1 120, M2 130, M3 140, and M4 150, are shown in FIG. 1. Of course, different types of ICs or ICs fabricated using different processes may require more or less than four metal layers for circuit interconnection.

In between each conducting layer is an insulating layer 115, 125, 135, 145 as shown in FIG. 1. Insulating layers are present to provide electrical isolation and mechanical spacing between conducting layers. To interconnect the conducting layers, vias 116 are formed through the insulating layers and are filled with conducting material (e.g., a metal or metal silicide).

In forming the structure of FIG. 1, after the active layers 110 are formed, an insulating layer 115 is formed over the active layers 110, for instance, by growth or deposition of insulating material. Next, a masking step is utilized to form vias in the insulating layer, as is generally known in the art. Such masking often entails depositing a photoresist layer and patterning the layer using ultra-violet light, enabling removal of only selected portions of the photoresist, and then etching the insulating layer in accordance with the photoresist pattern. After forming the vias, a conducting layer is deposited and then patterned using a similar masking process, so that metal (or other conductor such as a metal silicide) remains only in desired locations. The process is repeated for each insulating layer and conducting layer required to be formed. Thus each conducting layer required to be formed generally demands at least two masking steps: one step to form vias through the insulating layer to connect to the layer below and one step to form connection wires or lines.

Referring to FIG. 2a, at the active layer level, ASIC active devices are generally grouped to form function blocks 210, also commonly referred to as "cells" or "modules." The function blocks 210 are arranged to form an array 200. In particular, in structured ASICs the active devices within function blocks are interconnected (using one or more conducting layers) to form predefined function block circuits. As a simple example, such a function block circuit may include one or more multiplexers, as shown in FIG. 2b. Other more complicated function block circuits can include both combinational circuitry (e.g., Boolean logic and multiplexers) as well as sequential circuitry. (e.g., latches and flip-flops), as shown in FIG. 2c. Frequently, each function block in the array is identical to the rest. However, some structured ASICs have more than one type of function block.

In structured ASICs array 200 is sometimes loosely referred to as the "base array" because the predefined function blocks 210 correspond to lower fabrication layers that act as a foundation (or base) for the higher customization layers. However, as used hereinafter, "base array" more specifically means those layers of a structured ASIC that are adapted to be prefabricated. The number and type of layers adapted to be prefabricated in the base array will vary by embodiment.

Each function block circuit can generally be configured to perform a selected logic function by controlling the inputs to the function block, e.g., coupling the inputs to power, ground, an I/O pad, or to the output of another function block. Hence, to customize a structured ASIC to implement an ad hoc circuit design defined by a user, routing between the function blocks (and sometimes within the function blocks) must be customized. Typically, these custom conducting layers are the top metal layers for the device, enabling the base array of the structured ASIC to be prefabricated prior to receiving an ad hoc circuit design from a user, thus further enabling rapid customization time.

In addition to routing amongst function blocks, customized routing in structured ASICs generally includes defining and routing clock resources. In particular, custom routing resources are frequently used to build "clock trees" which drive clock inputs to sequential elements like flip-flops and latches. Nonetheless, the majority of custom routing for structured ASICs is performed automatically by place and route software. Yet such automatic place and route of clock resources does not typically yield optimal clock skew because buffers and routes for clock trees cannot always be optimally placed and routed due to competition for resources with other (non-clock) parts of the circuit. Manual placement of clock routing resources is simply undesirable.

Moreover, the electronics industry continues to demand smaller devices. Hence any structured ASIC that can maintain the same functionality but in a smaller package to that done currently (or the same size package with additional functionality) would be desirable.

SUMMARY

The invention may be implemented in numerous ways, including as a process, an article of manufacture, an apparatus, a system, a composition of matter, and a computer readable medium such as a computer readable storage medium or a computer network wherein program instructions are sent over optical or electronic communication links. In this specification, these implementations, or any other form that the invention may take, may be referred to as techniques. In general, the order of the steps of disclosed processes may be altered within the scope of the invention. The Detailed Description provides an exposition of one or more embodiments of the invention that enable improvements in performance, efficiency, and utility of use in the field identified above. The Detailed Description includes an Introduction to facilitate the more rapid understanding of the remainder of the Detailed Description. The Introduction includes Illustrative Combinations that tersely summarize illustrative systems and methods in accordance with the concepts taught herein. As is discussed in more detail in the Conclusions, the invention encompasses all possible modifications and variations within the scope of the issued claims.

BRIEF DESCRIPTION OF DRAWINGS

Various embodiments of the invention are disclosed in the following detailed description and the accompanying drawings, summarized below.

DETAILED DESCRIPTION

Figure 1:
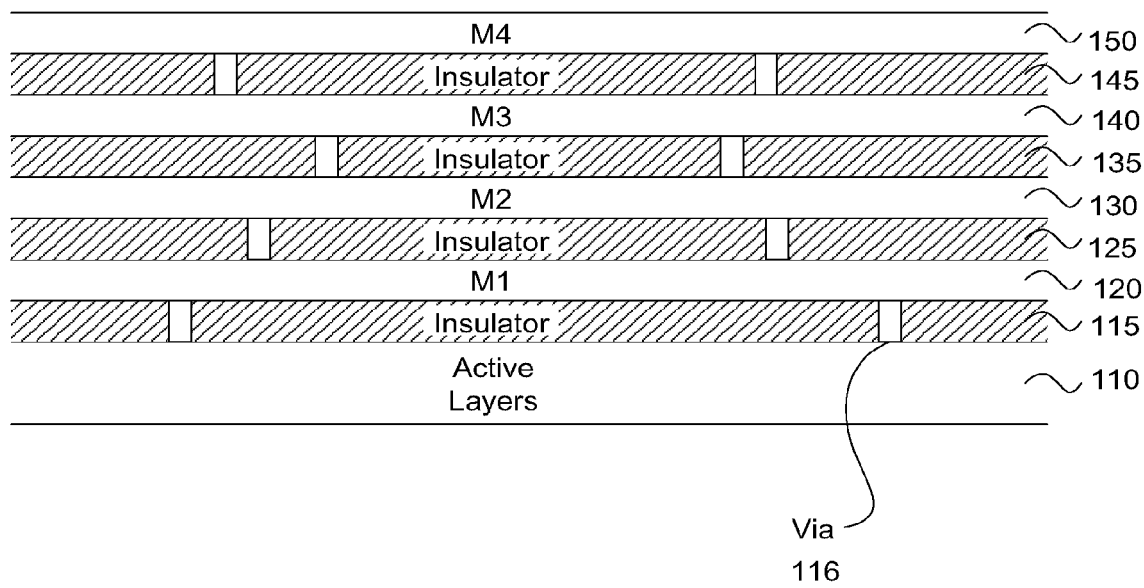
FIG. 1 is a generalized cross-sectional view of a generic integrated circuit.

A detailed description of one or more embodiments of the invention is provided below along with accompanying figures that illustrate the principles of the invention. The invention is described in connection with the embodiments. It is well established that it is neither necessary, practical, or possible to exhaustively describe every embodiment of the invention. Thus the embodiments herein are understood to be merely illustrative, the invention 8 is expressly not limited to or by any or all of the embodiments herein, and the invention encompasses numerous alternatives, modifications and equivalents. The existence of an embodiment in some way distinct from other embodiments may be described by such adjectives as "notable", "particular", "some", or equivalents thereof. All such similar characterizations should be considered to be interchangeable, being variously used to avoid monotony in the exposition and should not be construed as limiting the invention in any way or that the embodiments so labeled should be treated any differently than the other embodiments, as every embodiment described herein can be so characterized. Wherever multiple embodiments serve to illustrate variations in process, method, and/or program instruction features, other implementations are contemplated that in accordance with a predetermined or a dynamically determined criterion perform static and/or dynamic selection of one of a plurality of modes of operation corresponding respectively to a plurality of the multiple embodiments. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

INTRODUCTION

This introduction is included only to facilitate the more rapid understanding of the Detailed Description. The invention is not limited to the concepts presented in the introduction, as the paragraphs of any introduction are necessarily an abridged view of the entire subject and are not meant to be an exhaustive or restrictive description. For example, the introduction that follows provides overview information limited by space and organization to only certain embodiments. There are in fact many other embodiments, including those to which claims will ultimately be drawn, which are discussed throughout the balance of the specification.

A system and device in accordance with a first embodiment allows a portion of a clock structure to be defined that minimizes clock skew in a structured ASIC while also minimizing consumption of routing resources in forming the clock structure.

Another embodiment can be used to increase the effective flip-flop density in a structured ASIC. This embodiment includes a base array, an H-tree formed in at least one conducting layer above the base array, and at least one custom conducting layer above at least one of the layers forming the H-tree. The base array includes a plurality of sequential elements, such as flip-flops or latches. In some embodiments, from the user/ad-hoc-designer's perspective, the H-tree is predefined in an at least partially fixed conducting layer over the base array. In other embodiments, the H-tree is at least partially formed in at least one prefabricated conducting layer within the base array. The H-tree includes a center and a plurality of endpoints. In one embodiment at least some of the endpoints terminate at respective sequential elements. In another embodiment at least some of the endpoints terminate near respective sequential elements and the custom conducting layer couples selected endpoints to the respective sequential elements.

Another embodiment includes a base array to be used to in conjunction with custom routing layers to implement an ad hoc circuit design, an H-tree over the base array, and a pulse generator coupled to the H-tree. In various embodiments, at least one of the H-tree and the pulse generator are from the user/ad-hoc-designer's perspective predefined in an at least partially fixed conducting layer over the base array. In other embodiments, at least one of the H-tree and the pulse generator are at least partially prefabricated within the base array. In one embodiment, the base array includes a plurality of latches and the endpoints of the H-tree terminate at gate inputs to respective latches. In another embodiment the endpoints terminate near the gate inputs to respective latches and a custom conducting layer couples selected endpoints to respective latches.

As used herein, the term "fixed" (as applied to a layer or part thereof) means predefined (such as by a design constraint)—that is, defined prior to receipt of an ad hoc circuit design from a user—but does not necessarily mean prefabricated. Constraining an entire layer to be both fixed and interoperable with subsequent layers essentially adapts the layer to be prefabricated. If such a layer is prefabricated it can be considered an extension of the base array. The term "forming" as used herein means physically instantiating. Describing (defining, designing, or specifying) are implied prerequisites to forming. The techniques taught herein include design methods that are distinct in their own right independent of the physical implementations that the designs represent. In furtherance of this view, for each occurrence of "forming" in the method illustrative combinations below, corresponding design method combinations are envisioned wherein the word "describing" is instead used.

ILLUSTRATIVE COMBINATIONS

This introduction concludes with a collection of exemplary illustrative combinations, including some explicitly enumerated as "ECs", that tersely summary illustrative systems and methods in accordance with the concepts taught herein. Each of the illustrative combinations or ECs highlights various combinations of features using an informal pseudo-claim format. These compressed descriptions are not meant to be mutually exclusive, exhaustive, or restrictive, and the invention is not limited to these highlighted combinations. As is discussed in more detail in the Conclusion section, the invention encompasses all possible modifications and variations within the scope of the issued claims.

EC1) An integrated circuit comprising:
a base array, including a plurality of sequential elements;
an H-tree formed over at least part of the base array; and
a custom conducting layer formed over at least part of the H-tree.

EC2) The integrated circuit of claim EC1, wherein:
the H-tree is at least partially formed within a fixed conducting layer.

EC3) The integrated circuit of claim EC1, wherein:
the H-tree is formed with a fixed conducting layer,
the H-tree includes a plurality of endpoints, wherein each endpoint terminates near a respective sequential element; and
the custom conducting layer couples respective endpoints of the H-tree to respective inputs of the sequential elements.

EC4) The integrated circuit of claim EC1, wherein:
the H-tree is formed with a fixed conducting layer; and
the H-tree includes a plurality of endpoints, wherein each endpoint is coupled to a respective sequential element.

EC5) The integrated circuit of claim EC1, wherein the H-tree has a center and
the custom routing layer couples the center to a clock signal line.

EC6) An integrated circuit comprising:
a base array, including a plurality of sequential elements;
an H-tree having a plurality of endpoints in at least one conducting layer over the base array; and
wherein each respective endpoint of the H-tree terminates near a respective sequential element in the base array.

EC7) The integrated circuit of claim EC6, including a plurality of H-trees over the base array.

EC8) The integrated circuit of claim EC6, further including:
at least one custom conducting layer over the H-tree; and
wherein the at least one custom conducting layer includes conductors coupling the respective endpoints of the H-tree to respective sequential elements and coupling the center of the H-tree to a clock signal line.

EC9) The integrated circuit of claim EC6, further including:
at least one custom conducting layer over the H-tree; and
wherein the at least one custom conducting layer includes conductors coupling a first set of the respective endpoints of the H-tree to respective sequential elements, coupling a second set of the respective endpoints to dummy loads, and coupling the center of the H-tree to a clock signal line.

EC10) The integrated circuit of claim EC6, wherein:
the sequential elements are flip-flops; and
each respective endpoint of the H-tree terminates near a clock input of a respective flip-flop.

EC11) The integrated circuit of claim EC6, wherein:
the sequential elements are latches; and
each respective endpoint of the H-tree terminates near a gate input of a respective latch.

EC12) The integrated circuit of claim EC6, wherein:
the at least one conducting layer is fixed.

EC13) An integrated circuit comprising:
a base array, wherein the base array is divided into clusters, each cluster including a plurality of sequential elements;
an H-tree having a plurality of endpoints in at least one fixed conducting layer over each cluster; and
wherein each endpoint of the H-tree terminates near a respective sequential element in the base array.

EC14) The integrated circuit of claim EC13, wherein:
the base array is an array of function blocks; and
each cluster includes a plurality of function blocks.

EC15) The integrated circuit of claim EC13, wherein:
the base array is an array of function blocks; and
each cluster includes a function block.

EC16) The integrated circuit of claim EC13, further including:
at least one custom conducting layer over the H-tree; and
wherein the at least one custom conducting layer includes conductors coupling the respective endpoints of the H-tree to respective sequential elements and coupling the center of the H-tree to a clock signal line.

EC17) The integrated circuit of claim EC13, further including:
at least one custom conducting layer over the H-tree; and
wherein the at least one custom conducting layer includes conductors coupling a first set of the respective endpoints of the H-tree to respective sequential elements, coupling a second set of the respective endpoints to dummy loads, and coupling the center of the H-tree to a clock signal line.

EC18) The integrated circuit of claim EC13, wherein:
the sequential elements are flip-flops; and
each respective endpoint of the H-tree terminates near a clock input of a respective flip-flop.

EC19) The integrated circuit of claim EC13, wherein:
the sequential elements are latches; and
each respective endpoint of the H-tree terminates near a gate input of a respective latch.

EC20) A method comprising:
forming a base array, wherein the base array includes sequential elements; and
forming an H-tree with a plurality of endpoints in at least one conducting layer over the base array, wherein the endpoints of the H-tree terminate near sequential elements in the base array.

EC21) The method of claim EC20, wherein forming an H-tree over the base array includes forming a plurality of H-trees over the base array.

EC22) The method of claim EC20, further including:
forming at least one custom conducting layer over the H-tree; and
wherein the at least one custom conducting layer includes conductors coupling respective endpoints of the H-tree to respective sequential elements and coupling the center of the H-tree to a clock signal line.

EC23) The method of claim EC20, further including:
forming at least one custom conducting layer over the H-tree; and
wherein the at least one custom conducting layer includes conductors respectively coupling a first set of endpoints of the H-tree to respective sequential elements, respectively coupling a second set of endpoints to dummy loads, and coupling the center of the H-tree to a clock signal line.

EC24) The method of claim EC20, wherein:
the sequential elements are flip-flops; and
each respective endpoint of the H-tree terminates near a clock input of a respective flip-flop.

EC25) The method of claim EC20, wherein:
the sequential elements are latches; and
each respective endpoint of the H-tree terminates near a gate input of a respective latch.

EC26) The method of claim EC20, wherein:
the at least one conducting layer was fixed (predefined) prior to receipt of an ad hoc circuit design that in conjunction with the base array and the at least one fixed conducting layer define at least in part the functionality of the integrated circuit.

EC27) A method of forming a customizable integrated circuit including:
forming a base array, wherein the base array is divided into clusters, at least some of the clusters including a plurality of sequential elements;
forming an H-tree having a plurality of endpoints over at least some of the clusters in at least one fixed conducting layer,
wherein at least some of the endpoints terminate near at least one corresponding sequential element in the base array.

EC27a) The method of claim EC27, wherein:
each of the clusters includes a respective plurality of the sequential elements;
the H-trees having a plurality of endpoints are formed over each of the clusters; and
the sequential elements in the base array include at least one sequential element corresponding and near to each endpoint termination.

EC28) The method of claim EC27, wherein:
the base array includes an array of function blocks; and
each cluster includes a plurality of the function blocks.

EC29) The method of claim EC27, wherein:
the base array includes an array of function blocks; and
each cluster includes one of the function blocks.

EC30) The method of claim EC27, further including:
forming at least one custom conducting layer over the H-tree;
wherein the at least one custom conducting layer includes conductors at least in part coupling respective endpoints of the H-tree to respective sequential elements and at least in part coupling the center of the H-tree to a clock signal line.

EC31) The method of claim EC27, further including:
forming at least one custom conducting layer over the H-tree;
wherein the at least one custom conducting layer includes conductors respectively coupling at least in part a first set of endpoints of the H-tree to respective sequential elements, respectively coupling at least in part a second set of endpoints to dummy loads, and coupling at least in part the center of the H-tree to a clock signal line.

EC32) The method of claim EC27, wherein:
the sequential elements are flip-flops; and
at least some of the endpoints of the H-tree terminate near a clock input of a respective flip-flop.

EC33) The method of claim EC27, wherein:
the sequential elements are latches; and
at least some of the endpoints of the H-tree terminate near a gate input of a respective latch.

EC34) A method of forming a customizable integrated circuit including:
forming a base array, wherein the base array includes sequential elements; and
forming an H-tree with a plurality of endpoints in at least one conducting layer over the base array, wherein at least a plurality of the endpoints of the H-tree are respectively coupled to at least a respective one of the sequential elements.

EC35) A customizable integrated circuit, comprising:
a base array to be used to implement an ad hoc circuit design;
an H-tree formed over the base array;
a pulse generator coupled to the H-tree.

EC36) The integrated circuit of claim EC35, wherein:
the base array, H-tree, and pulse generator are predefined.

EC37) The integrated circuit of claim EC35, wherein:
the base array, H-tree, and pulse generator are designed to be coupled to the one or more custom routing layers.

EC38) The integrated circuit of claim EC35, wherein:
the base array includes a plurality of latches;
the H-tree includes a plurality of endpoints and a center;
each respective endpoint terminates near a gate input of a respective latch;
the pulse generator is coupled to the center of the H-tree.

EC39) The integrated circuit of claim EC35, wherein:
the base array includes a plurality of latches;
the H-tree includes a plurality of endpoints and a center;
each respective endpoint terminates at a gate input of a respective latch;
the pulse generator is coupled to the center of the H-tree.

EC40) An integrated circuit comprising:
a base array, including a plurality of latches;
an H-tree formed over the base array, the H-tree having a center;
a pulse generator coupled to the center of the H-tree;
a custom conducting layer formed over the H-tree, the custom routing layer defined by an ad hoc circuit design to be implemented with the integrated circuit.

EC41) The integrated circuit of claim EC40, wherein:
the H-tree is formed with a fixed conducting layer.

EC42) The integrated circuit of claim EC40, wherein:
the H-tree is formed with a fixed conducting layer,
the H-tree includes a plurality of endpoints, wherein each respective endpoint terminates near a gate input of a respective latch;
the custom conducting layer couples respective endpoints of the H-tree to the gate inputs of respective latches.

EC43) The integrated circuit of claim EC40, wherein:
the H-tree is formed with a fixed conducting layer, and
the H-tree includes a plurality of endpoints, wherein each respective endpoint is coupled to a respective latch.

EC44) An integrated circuit, comprising:
a base array, including a plurality of latches, the base array formed using at least a first fixed conducting layer;
an H-tree formed over the base array, the H-tree having a center, and the H-tree formed using at least a second fixed conducting layer;
wherein the H-tree includes a plurality of endpoints, wherein each respective endpoint terminates near a gate input of a respective latch;
a pulse generator coupled to the center of the H-tree;
a custom conducting layer formed over the H-tree, the custom routing layer defined by an ad hoc circuit design to be implemented in the integrated circuit;
wherein the custom conducting layer couples respective endpoints of the H-tree to the gate inputs of respective latches.

EC45) An integrated circuit, comprising:
a base array;
means for emulating flip-flops with latches, where the flip-flops are defined in an ad hoc circuit design, the customized circuit design to be implemented using the base array, and wherein each flip-flop is emulated with a single latch.

EC46) A method of forming an integrated circuit, including:
forming a base array adapted to be prefabricated for use in a structured ASIC;
forming an H-tree over the base array;
forming a pulse generator coupled to the H-tree.

EC47) The method of claim EC46, wherein:
the base array, H-tree, and pulse generator are predefined prior to receipt of an ad hoc circuit design that in conjunction with the base array define at least in part the functionality of the integrated circuit.

EC48) The method of claim EC46, further including:
coupling the base array, H-tree, and pulse generator to one or more custom routing layers.

EC49) The method of claim EC46, wherein:
the base array includes a plurality of latches;
the H-tree includes a plurality of endpoints and a center;
at least some of the endpoints terminate at a gate of a respective latch of the plurality of latches; and
the pulse generator is coupled to the center of the H-tree.

EC50) The method of claim EC46, wherein:
the base array includes a plurality of latches;
the H-tree includes a plurality of endpoints and a center;
at least some of the endpoints terminate at a gate of a respective latch of the plurality of latches; and
the pulse generator is coupled to the center of the H-tree.

EC51) A method of forming an integrated circuit, including:
forming a base array, wherein the base array includes a plurality of latches;
forming an H-tree over the base array, the H-tree having a center;
forming a pulse generator coupled to the center of the H-tree; and
forming a custom conducting layer over the H-tree, the custom routing layer defined by an ad hoc circuit design.

EC52) The method of claim EC51, further including:
receiving the ad hoc circuit design after the forming of the base array, the forming of the H-tree, and the forming of the pulse generator.

EC53) The method of claim EC51, wherein:
the ad hoc circuit design was performed with a design constraint that the H-tree was predefined on an at least partially fixed conducting layer.

EC54) The method of claim EC51, wherein:
the ad hoc circuit design was performed with a design constraint that the H-tree was predefined on an at least partially fixed conducting layer;
the H-tree includes a plurality of endpoints, wherein each respective endpoint terminates near a gate input of a respective latch of the base array; and
the forming the custom conducting layer over the H-tree includes coupling at least in part the respective endpoints of the H-tree to the gate inputs of the respective latches.

EC55) The method of claim EC51, wherein:
the ad hoc circuit design was performed with a design constraint that the H-tree was predefined on an at least partially fixed conducting layer;
the H-tree includes a plurality of endpoints; and
each respective endpoint is coupled to a respective latch of the base array.

Particular Embodiments

Figure 2A:
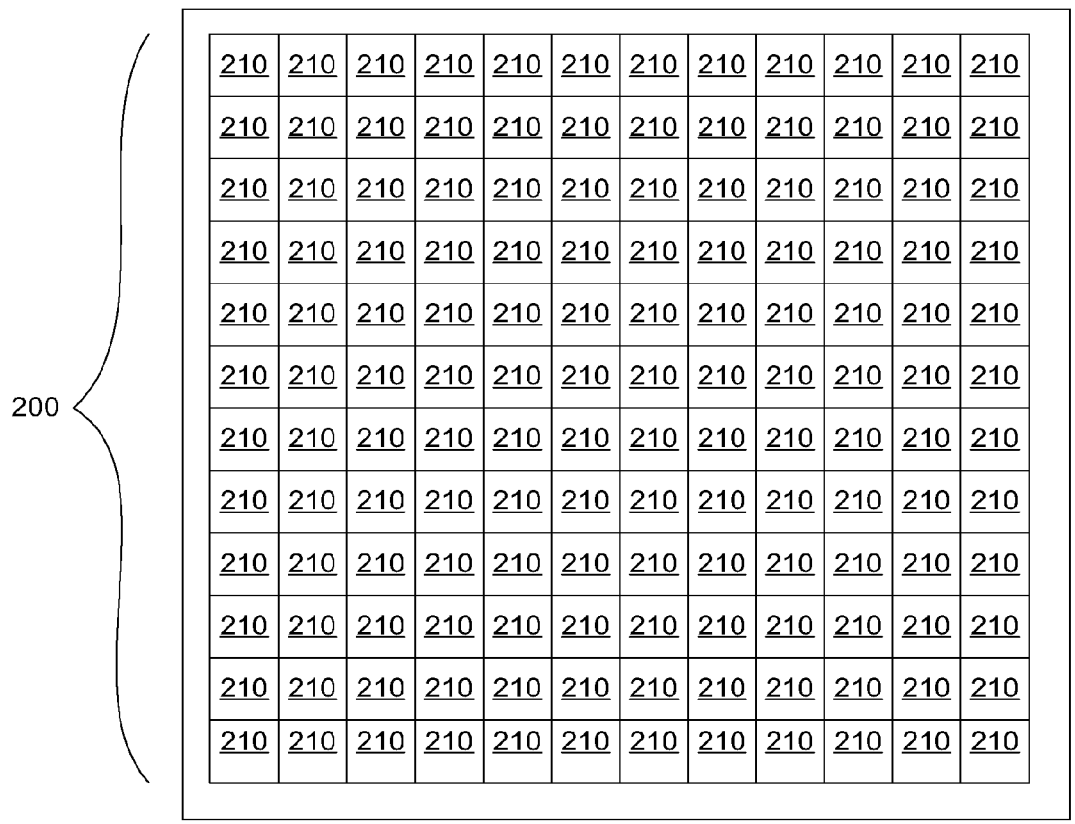
FIG. 2a is a block diagram of a structured ASIC.
Figure 2B:
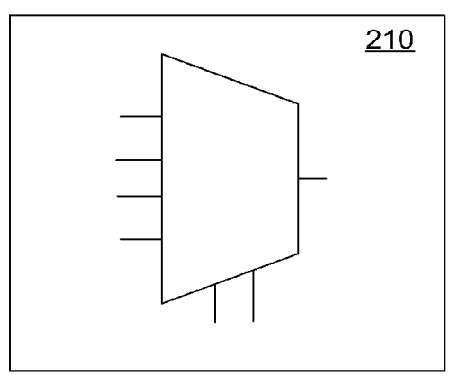
FIG. 2b is a first example function block circuit.
Figure 2C:
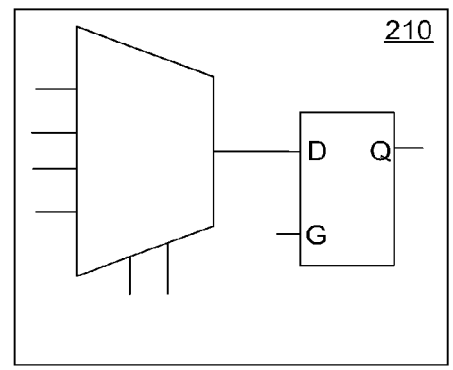
FIG. 2c is a second example function block circuit.

A first illustrative embodiment includes a structured ASIC such as that shown in FIG. 2a. The structured ASIC is prefabricated through a certain number of fixed conducting layers to form the base array. For purposes of discussion herein, two conducting layers, M1 and M2, are presumed to be used for forming the base array. It is to be understood, however, that more or fewer conducting layers could be used for the base array.

Figure 3:
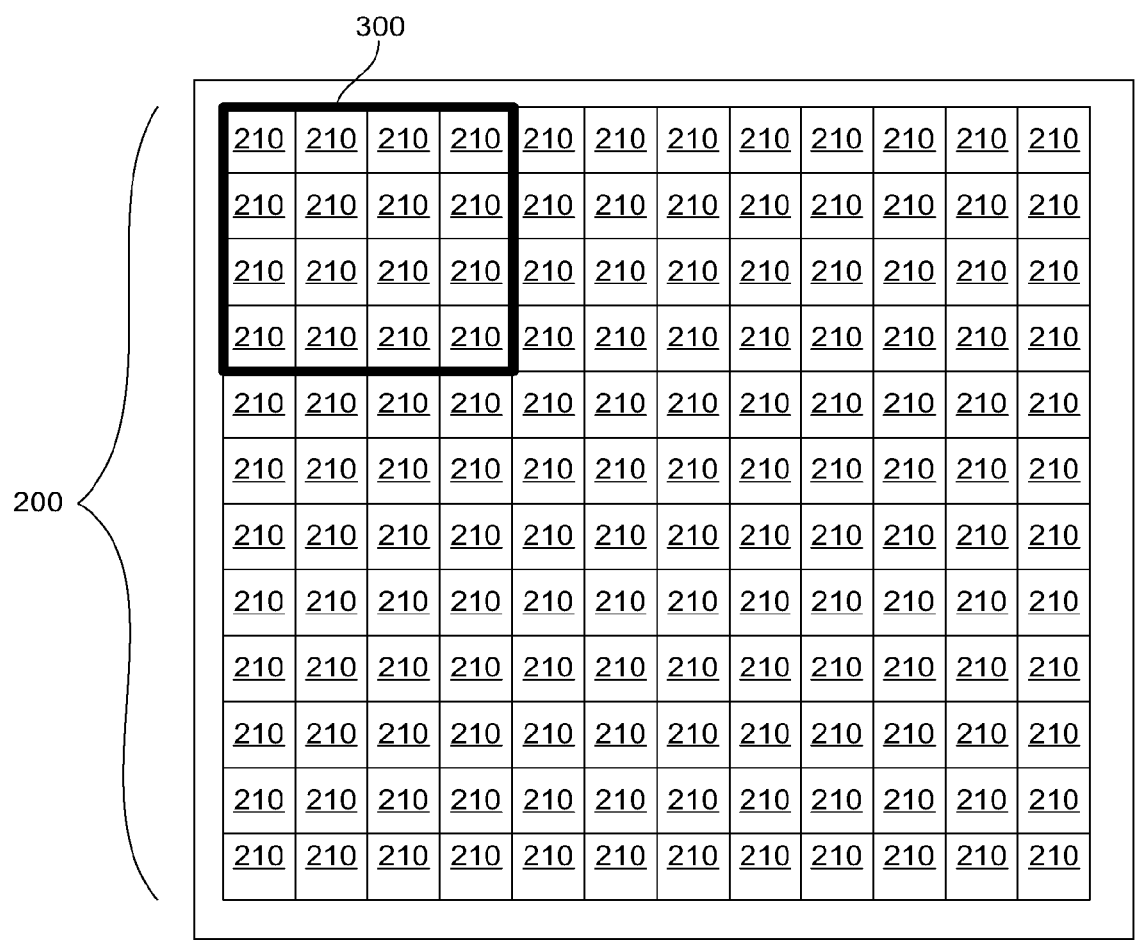
FIG. 3 is a block diagram of a structured ASIC in accordance with an embodiment with an example cluster outlined.

Referring to FIG. 3, the logic blocks (cells 210) in the array 200 are divided into clusters 300. Exemplary cluster 300 is shown in greater detail in FIG. 4 as having a selected number of sequential elements 310 (e.g., latches, flip-flops) along with combinational logic. Generally both sequential and combinational elements will be present in a cluster, however the particular design of function blocks may vary from embodiment to embodiment, and this is not a limitation of the techniques being taught. Although FIG. 3 shows sixteen function blocks in cluster 300 it is to be understood that a cluster may contain more or fewer function blocks in various embodiments. In some embodiments, a cluster may be defined as a single function block.

Figure 4:
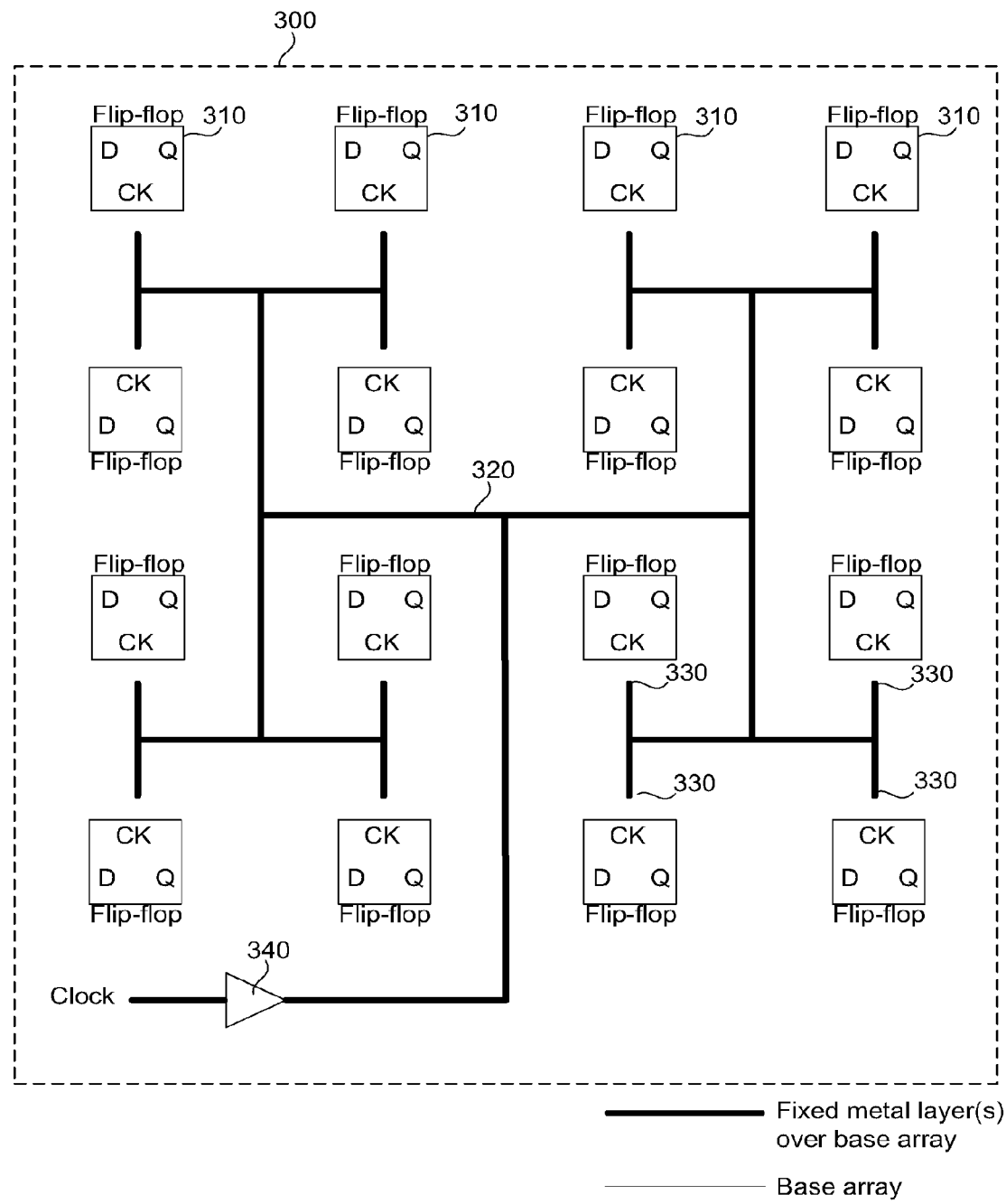
FIG. 4 is a functional block diagram of an H-tree in accordance with an embodiment.

In a class of embodiments illustrated in detail by FIG. 4, a buffered clock is routed to the sequential elements within at least some of the clusters via a so-called H-tree. In such clusters the resulting clock skew is improved over conventional techniques because the last level of the clock resources—the H-tree—is fixed and matched to all sequential elements in the cluster. In conventional techniques, this degree of matching is usually not possible with a completely custom routed clock tree. Moreover, in certain embodiments the H-tree can be implemented in conducting layers prefabricated within the base array, and the custom routing resources that would have otherwise been consumed by the H-tree are available for other routing needs.

Although it could potentially be formed in a single conducting layer (e.g., M3 or M4), the H-tree structure 320 will typically be formed with two conducting layers (e.g., M3 and M4)—one for "horizontal" routes and one for "vertical" routes as will be understood in the art. In embodiments having one or more conducting layers beyond those of the H-tree, the H-tree layers can be prefabricated if desired, effectively forming an H-tree-enhanced base array.

Achieving minimum clock skew is made more straightforward by: a) balancing the path-lengths to the endpoints of the H-tree, and b) balancing the loading at the endpoints of the H-tree. Endpoints with matched path-lengths and matched loads are thus generally desirable. However, it will be understood that neither matched endpoint path-lengths or matched endpoint loads are limitations of the techniques being taught.

The illustrative structure of FIG. 4 can be described as having 4 levels of center-driven balanced-branches (or layers of arms): a horizontal first-level balanced-branch center-driven by clock buffer 340; two vertical second-level balanced-branches driven by the first-level balanced-branch; four horizontal third-level balanced-branches driven by the second-level balanced-branches; and eight vertical fourth-level balanced-branches driven by the third-level balanced-branches. While the name-sake "H" shape is achieved once the first and second level of balanced-branches (arms) are present, as used herein an H-tree is not limited to even-numbered levels of balanced-branches (arms). That is, an H-tree can have an arbitrary number of levels of balanced-branches (arms).

As each balanced-branch (arm) has two ends, the number of endpoints is twice the number of balanced-branches (arms) at the highest-level. Accordingly, in matched path-length embodiments the number of balanced-branches (arms) at each level (layer), and the number of endpoints, goes up by a factor of two with each additional level of balanced-branches (layer of arms). Thus, although the illustrative embodiment of FIG. 4 illustrates an H-tree cluster having 4 layers of arms and 16 endpoints, other matched path-length embodiments will have endpoints per cluster numbering 4, 8, 16, 32, 64, or other integer power of 2, where the exponent is given by the number of layers of arms.

Achieving matched path-lengths within a cluster is made more straightforward when the H-tree of the cluster is symmetric about at least one of a vertical axis and a horizontal axis. Simultaneous horizontal and vertical symmetry and recursive (nested) symmetry is illustrated in the exemplary embodiment of FIG. 4. However, it will be understood that such symmetry is not a limitation of the techniques being taught.

The structure 320 can be described from a number of perspectives pertaining to symmetry. In a first-level symmetry perspective, the structure 320 can be described as having two symmetric vertical halves (left and a right), each half coupling to a subset of eight of the 16 sequential elements. (Each half corresponds to one of the two ends of the first-level balanced-branch described above.) In a second-level symmetry perspective, the structure 320 can be described as having four symmetric quadrants (upper-left, upper-right, lower-light, and lower-left), each quadrant coupling to a subset of four of the 16 sequential elements 310. (Each quadrant corresponds to one of the four ends of the two second-level balanced-branches.) In a third-level symmetry perspective, the structure 320 can be described as having eight symmetric eighths, each eighth coupling to a subset of two of the 16 sequential elements 310. (Each octant corresponds to one of the eight ends of the four third-level balanced branches.) In a fourth-level symmetry perspective, the structure 320 can be described as having 16 symmetric sixteenths, each sixteenth respectively coupling to one the 16 sequential elements 310. (Each sixteenth corresponds to one of the 16 ends of the eight fourth-level balanced branches.) Thus, for the illustrative but not limiting structure 320, the degree of symmetry of the H-tree scales with the number of endpoints of the balanced-branches, or as a power of 2. Other perspectives are possible. For example, in an alternate first-level symmetry perspective, the structure 320 can be described as having two symmetric horizontal halves: an upper and a lower half, each half coupling to a subset of eight of the 16 sequential elements. Again, it will be understood that such symmetry is not a limitation of the techniques being taught.

As shown in FIG. 4, each endpoint 330 of the H-tree structure 320 terminates at or near a clock or gate pin of each sequential element 3101 the cluster. While FIG. 4 illustrates 16 endpoints with 16 sequential elements, it will be understood that one sequential element per endpoint is not a limitation of the techniques being taught. More specifically, any small number of sequential elements could be placed at each endpoint of the H-tree structure. Although flip-flops are shown, other embodiments could use other sequential elements, such as latches. Achieving matched endpoint loading is made more straightforward if the logic at each endpoint is the same. However, it will be understood that having the same logic at each endpoint is not a limitation of the techniques being taught.

A buffer 340 is formed in the cluster using available combinational logic. The output of the buffer 340 is coupled to the center of the H-tree 320. The input of buffer 340 is intended to receive a clock signal, which may come from custom routed resources, subsequently formed in the custom routing layers.

Figure 5A:
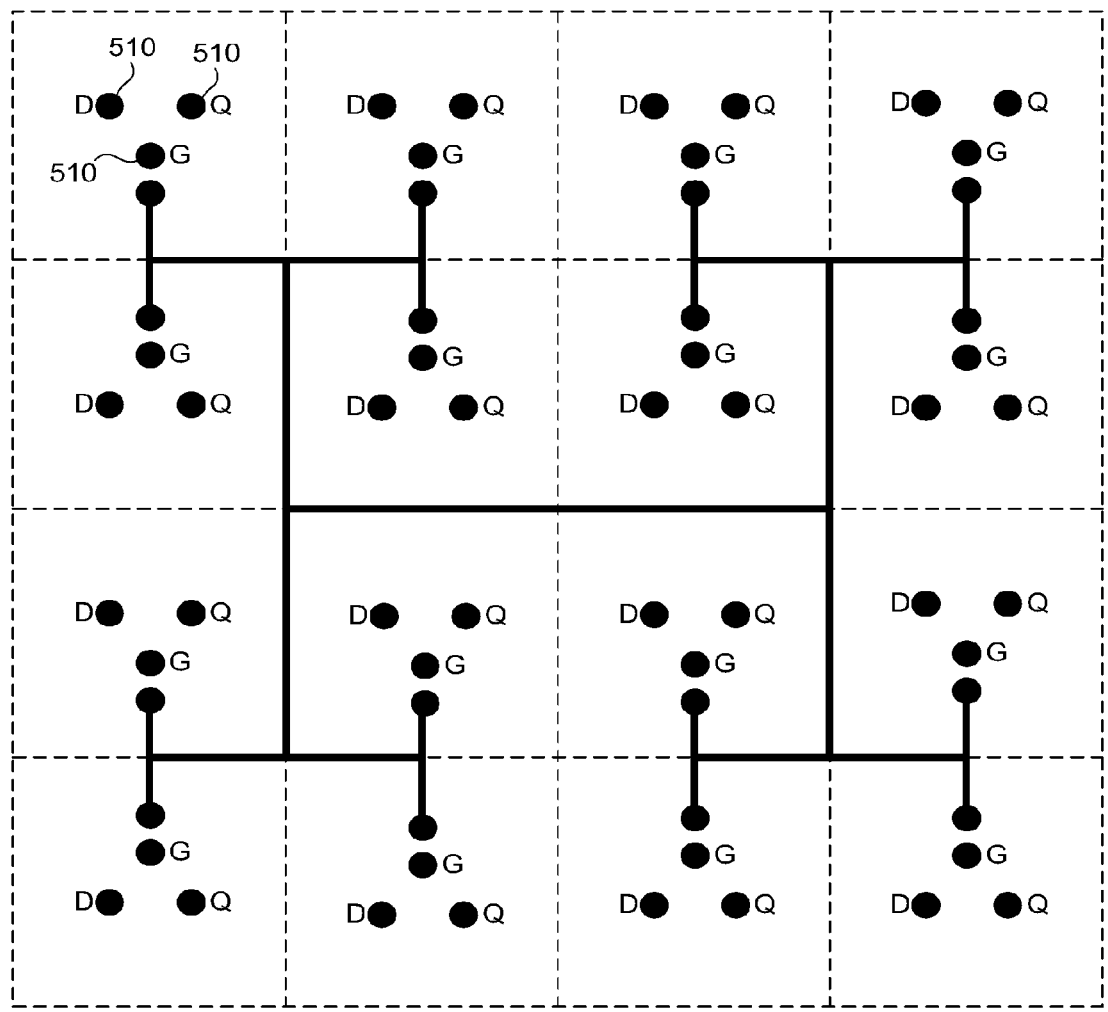
FIG. 5a is a block diagram of an example cluster showing fixed conducting layers containing the H-tree and "pins" for selective connections to custom upper layers.
Figure 5B:
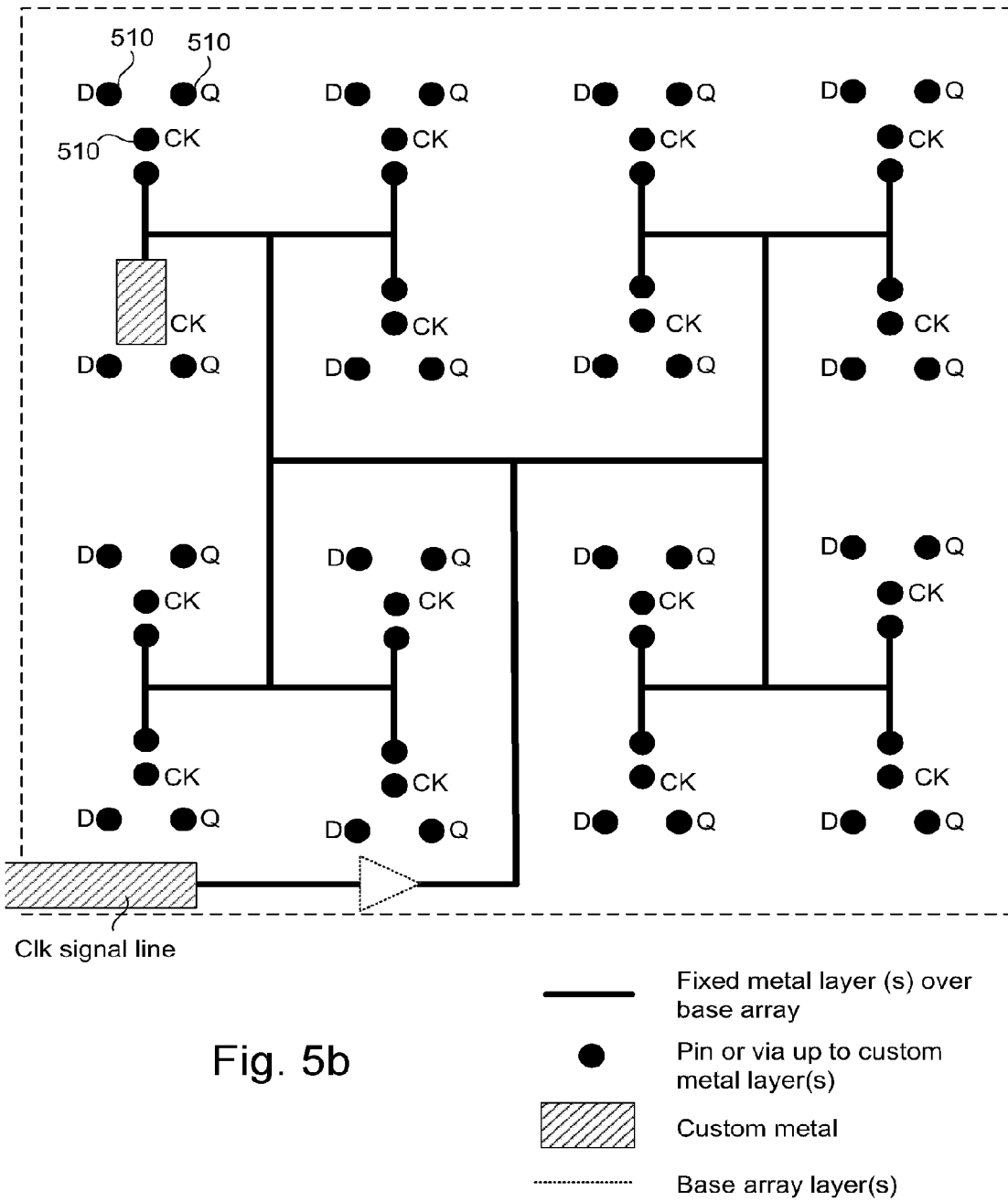
FIG. 5b is a block diagram of the embodiment of FIG. 4 showing fixed conducting layers containing the H-tree and a custom conducting layer formed over the fixed conducting layers.

As used herein and with reference to FIGS. 5a and 5b, the term "pin" refers to contacts 510 to the inputs and outputs of the function blocks 210 (of the cluster 300) and is formed through the various conducting and insulating layers (using vias) up to the custom conducting layers (e.g., M5), in one embodiment. In one embodiment the endpoints of the H-tree terminate at (they are coupled to) the sequential elements in fixed conducting layers. But in other embodiments, such as that of FIG. 5a, the endpoints of the H-tree terminate near the clock or gate pins of the respective sequential elements, but they are not "hard-wired" to them. Instead, the connection between the H-tree and the sequential elements is made in a custom conducting layer, e.g., M5. Hence, while the sequential elements can be easily coupled to the H-tree, they do not necessarily need to be. The determination of whether or not they are connected is dictated by the ultimate ad hoc circuit design to be implemented. For purposes of illustration only, FIG. 5b shows only one connection made from an H-tree endpoint to a clock pin. (Compare FIGS. 5b and 5a with reference to the sequential element of FIG. 5a at the intersection of the leftmost column with the second row from the top.) It is to be understood that custom metal can be used to similarly connect any or all of the H-tree components to the sequential elements.

Figure 6:
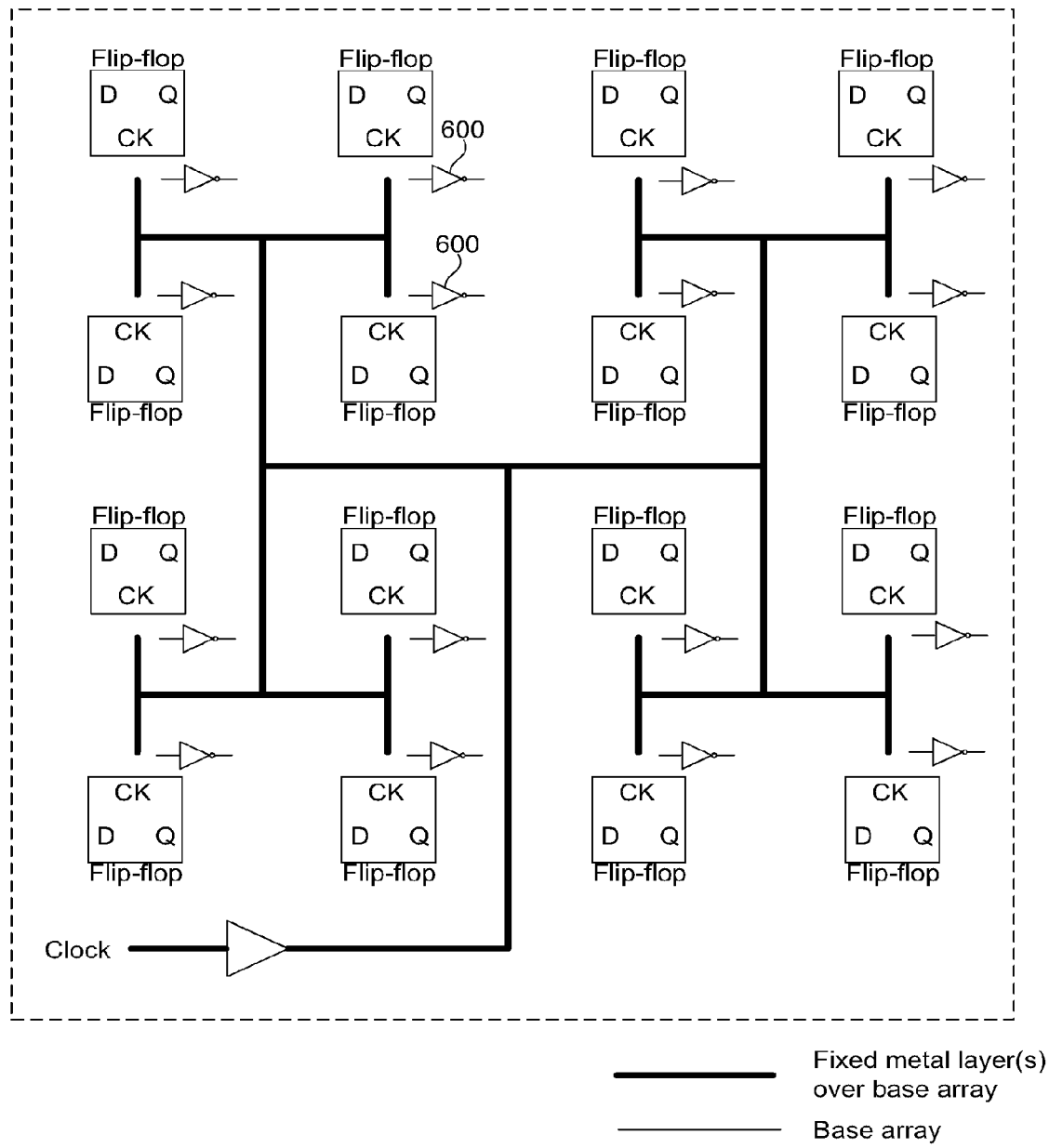
FIG. 6 is a function block diagram of an H-tree in accordance with another embodiment.

If an H-tree endpoint is not used, to maintain constant load, a "dummy load" is utilized at the unused endpoint in some embodiments. In one embodiment shown in FIG. 6, the dummy load is an inverter 600 provided near each sequential element in the cluster such that the input capacitance of the inverter is matched to the input capacitance of the clock or gate of the sequential element. If the H-tree endpoint is not used, the H-tree endpoint is instead coupled to the inverter (or other dummy load). Other embodiments may not require use of a dummy load for unused endpoints.

Although only one H-tree structure per cluster is described above, in other embodiments, a cluster can have more than one H-tree structure, allowing for multiple clock domains in the cluster (having only one H-tree implies the use of only one clock domain unless custom clock trees are also used to support arbitrary numbers of clock domains per cluster). As will be understood in the art, an additional H-tree would be formed with parallel H-tree routes to those of the first H-tree and in the same conducting layers as the first H-tree in one embodiment. Nonetheless, although multiple H-trees can be formed, one or two H-trees are preferably used for optimal density in one embodiment. In embodiments where more than two clock domains are required for the structural ASIC, sequential elements are preferably placed in the array so that only the desired number (e.g., 1 or 2) of H-trees per cluster are obtained.

In addition to improving clock skew, H-trees used in structured ASICs can also be used for increasing the effective flip-flop density by emulating each individual flip-flop in a circuit design with an individual latch. In particular and referring to FIG. 7, in an embodiment where the sequential elements of the cluster are latches 720, a one-shot pulse generator 710 is used with each cluster 300 in one embodiment where the output of the one-shot is brought to the center of the H-tree and the input receives a clock signal, which may be from custom clock resources. As with use of H-trees to control clock skew, although the endpoints of the H-tree can be coupled directly to the gates of latches, in one embodiment, each endpoint of the H-tree is brought near to but not hard-wired to the gates of the respective latches. A custom conducting layer can then be used to selectively couple respective endpoints to respective latches. If a latch is not being connected to the H-tree, a dummy load, similar to that described previously (see FIG. 6) may be used for load balancing in some embodiments, although a dummy load may not be required in all embodiments.

Figure 8:
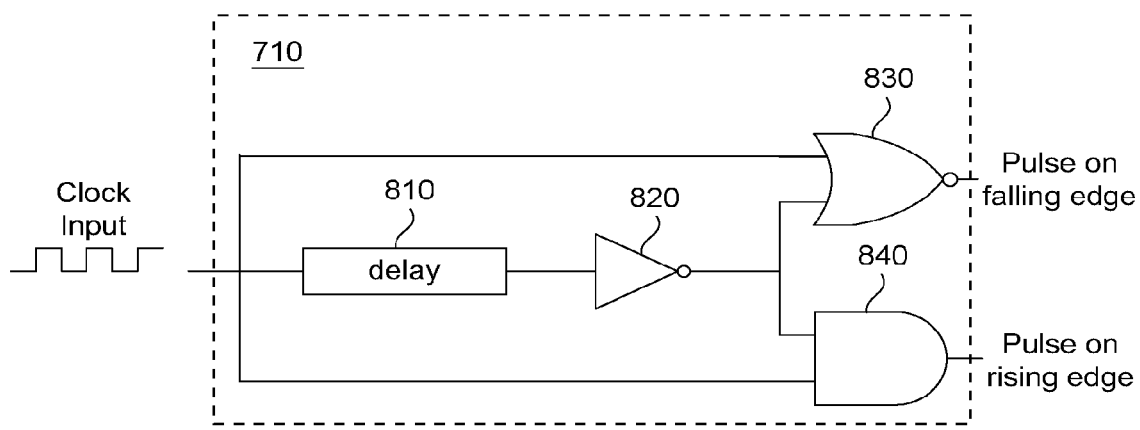
FIG. 8 is a functional block diagram of an exemplary one-shot pulse generator used with one embodiment.

An example one-shot is shown in FIG. 8. As shown, one-shot 710 includes a delay element 810 whose output is coupled to the input of inverter 820. The output of inverter 820 is coupled to one input of NOR gate 830 and one input of AND gate 840. The other inputs in NOR gate 830 and AND gate 840, as well as the input to delay element 810, are coupled to a clock signal line. When a clock signal is supplied to one-shot 710 NOR gate 830 will output a pulse on the falling edge of the clock and AND gate 840 will output a pulse on the rising edge of the clock. The width of the pulse is dependent on the length of delay supplied by delay element 810, as is understood in the art. Although FIG. 8 illustrates a one-shot used in one embodiment, those of skill in the art will recognize many other ways to form a pulse generator and FIG. 8 should be understood to be exemplary only.

Figure 9:
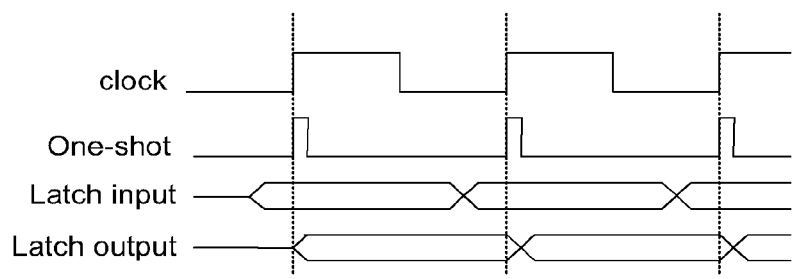
FIG. 9 is a timing diagram for the embodiment illustrated in FIG. 7.

As seen in the timing diagram of FIG. 9, and as a result of using a pulse generator to generate a narrow pulse off of the rising or falling edge of a conventional clock, the behavior of each latch emulates that of a flip-flop but takes up approximately half the space of a flip-flop (which is generally formed from two latches). Because the one-shot is used to simultaneously clock several latches at the same time, near-perfect clock skew is maintained amongst the devices on the H-tree. Moreover, since the H-tree structure is fixed and of equal length to each latch, pulse fidelity can be pre-characterized and guaranteed to all latches in each cluster.

If only one H-tree is used in a cluster for flip-flop emulation, all of the "flip-flops" in the cluster are in the same clock domain and must be only rising edge triggered or only falling-edge triggered. But as described previously, more than one H-tree can be used in a particular cluster.

Although latches clocked with a one-shot pulse generator can emulate flip-flops, a problem arises for timing verification. When an end-user provides a netlist to the ASIC provider, the netlist includes conventional flip-flops coupled to clock trees. However, in illustrative embodiments, the conventional flip-flops are mapped to sets of latches driven by one-shots, which in turn are driven by clock trees. This presents a problem for parasitic extraction, static timing analysis, and variable-delay simulation. Although post-place and route software could output a new netlist with one-shots and latches (but no flip-flops), such a new netlist would probably fail formal verification against the original netlist. In addition the extraction of the embedded H-tree (in fixed metal) would be difficult to combine with the extraction of the nets implemented in custom metal. Accordingly, in one embodiment, the latches and one-shot are characterized as a single library element. In one embodiment the single library element is a register where the number of bits per register is equal to the number of latches in the cluster. The post-place and route software then builds a netlist with the registers, which can extract and simulate as conventional logic.

CONCLUSION

Although the foregoing embodiments have been described in some detail for purposes of clarity of understanding, the invention is not limited to the details provided. There are many ways of implementing the invention. The disclosed embodiments are illustrative and not restrictive.

It will be understood that many variations in construction, arrangement and use are possible consistent with the teachings and within the scope of the claims of the issued patent. For example, interconnect and function-unit bit-widths, clock speeds, and the type of technology used may generally be varied in each component block. The names given to interconnect and logic are merely illustrative, and should not be construed as limiting the concepts taught. The order and arrangement of flowchart and flow diagram process, action, and function elements may generally be varied. Also, unless specifically stated to the contrary, the value ranges specified, the maximum and minimum values used, or other particular specifications (such as integration techniques and design flow technologies), are merely those of the illustrative embodiments, may be expected to track improvements and changes in implementation technology, and should not be construed as limitations.

Functionally equivalent techniques known to those of ordinary skill in the art may be employed instead of those illustrated to implement various components, sub-systems, functions, operations, routines, and sub-routines. It is also understood that many design functional aspects may be carried out in either hardware (i.e., generally dedicated circuitry) or software (i.e., via some manner of programmed controller or processor), as a function of implementation dependent design constraints and the technology trends of faster processing (which facilitates migration of functions previously in hardware into software) and higher integration density (which facilitates migration of functions previously in software into hardware). Specific variations may include, but are not limited to: differences in partitioning; different form factors and configurations; use of different operating systems and other system software; use of different interface standards, network protocols, or communication links; and other variations to be expected when implementing the concepts taught herein in accordance with the unique engineering and business constraints of a particular application.

The embodiments have been illustrated with detail and environmental context well beyond that required for a minimal implementation of many of aspects of the concepts taught. Those of ordinary skill in the art will recognize that variations may omit disclosed components or features without altering the basic cooperation among the remaining elements. It is thus understood that much of the details disclosed are not required to implement various aspects of the concepts taught. To the extent that the remaining elements are distinguishable from the prior art, components and features that may be so omitted are not limiting on the concepts taught herein.

Certain choices have been made in the presentation of this disclosure merely for reasons of convenience in preparing the text and drawings and unless there is an indication to the contrary these choices of convenience should not be construed per se as conveying additional information regarding the structure of the embodiments illustrated. Illustrative examples of such choices of convenience include: the particular organization or assignment of the designations used for the figure numbering and the particular organization or assignment of the element identifiers (a.k.a. callouts or numerical designators) used to identify and reference the features and elements of the embodiments.

All such variations in design comprise insubstantial changes over the teachings conveyed by the illustrative embodiments. It is also understood that the concepts taught herein have broad applicability to other computing and networking applications, and are not limited to the particular application or industry of the illustrated embodiments. The invention is thus to be construed as including all possible modifications and variations encompassed within the scope of the claims of the issued patent.

What is claimed is:

1. A method of designing a structured ASIC-based integrated circuit, the method comprising:
   generating, by a computing apparatus, an ad hoc circuit design defining, at least in part and in conjunction with a base array of function blocks, a functionality of the structured ASIC-based integrated circuit, wherein the function blocks are organized into clusters of one or more of the function blocks, wherein at least some of the clusters include a plurality of sequential elements and one or more H-trees respectively over one or more of the clusters, wherein at least one H-tree of the one or more H-trees has a plurality of endpoints, and wherein at least some of the plurality of endpoints terminate near at least one corresponding sequential element of the plurality of sequential elements; and
   imposing, by the computing apparatus, design constraints on the ad hoc circuit design including a first design constraint that one or more of the H-trees correspond to the clusters having sequential elements and a second design constraint that one or more of the H-trees, in conjunction with one or more conducting layers over the H-trees, couple the sequential elements of the corresponding clusters to one or more associated one-shot pulse generators such that the coupled sequential elements emulate flip-flop functionality as observed by the ad hoc circuit design.

2. The method of claim 1, wherein at least one of the clusters includes a plurality of the function blocks.

3. The method of claim 1, wherein at least one of the clusters includes one of the function blocks.

4. The method of claim 1, wherein the H-trees corresponding to the clusters having sequential elements are configured to provide matched path-lengths between each of the coupled sequential elements of each corresponding cluster and the one or more associated one-shot pulse generators.

5. An integrated circuit comprising:
   a base array including a plurality of sequential elements; and
   an H-tree having a plurality of endpoints in a conducting layer over the base array, wherein at least one of the plurality of endpoints terminates near a respective sequential element in the base array.

6. The integrated circuit of claim 5, wherein the sequential elements comprise at least one of latches or flip-flops.

7. The integrated circuit of claim 5, wherein at least one of the plurality of endpoints terminates near a gate input of a respective sequential element in the base array.

8. The integrated circuit of claim 5, further comprising a pulse generator coupled to a center of the H-tree.

9. The integrated circuit of claim 5, wherein the conducting layer comprises conductors coupling a first set of the plurality of endpoints to respective sequential elements, coupling a second set of the plurality of endpoints to dummy loads, and coupling a center of the H-tree to a clock signal line.

10. The integrated circuit of claim 5, wherein the sequential elements are flip-flops, and wherein at least one of the plurality of endpoints terminates near a clock input of a respective flip-flop.

11. The integrated circuit of claim 5, wherein the sequential elements are latches, and wherein at least one of the plurality of endpoints terminates near a gate input of a respective latch.

12. A method comprising:
   forming, b a computing a base array including a plurality of sequential elements; and
   forming an H-tree having a plurality of endpoints in a conducting layer over the base array, wherein at least one of the plurality of endpoints terminates near a respective sequential element in the base array.

13. The method of claim 12, wherein the sequential elements comprise at least one of latches or flip-flops.

14. The method of claim 12, wherein said forming an H-tree comprises terminating at least one of the plurality of endpoints near a gate input of a respective sequential element in the base array.

15. The method of claim 12, further comprising coupling a pulse generator to a center of the H-tree.

16. The method of claim 12, wherein said forming an H-tree comprises coupling a first set of the plurality of endpoints to respective sequential elements, coupling a second set of the plurality of endpoints to dummy loads, and coupling a center of the H-tree to a clock signal line.

17. The method of claim 12, wherein the sequential elements are flip-flops, and wherein said forming an H-tree comprises terminating at least one of the plurality of endpoints near a clock input of a respective flip-flop.

18. The method of claim 12, wherein the sequential elements are latches, and wherein said forming an H-tree comprises terminating at least one of the plurality of endpoints near a gate input of a respective latch.

19. A system comprising:
a processing unit; and
a tangible non-transitory computer-readable medium coupled to the processing unit and having instructions stored thereon, the instructions comprising:
instructions to generate an ad hoc circuit design defining, at least in part and in conjunction with a base array of function blocks, a functionality of a structured ASIC-based integrated circuit, wherein the function blocks are organized into clusters of one or more of the function blocks, wherein at least some of the clusters include a plurality of sequential elements and one or more H-trees respectively over one or more of the clusters, wherein at least one H-tree of the one or more H-trees has a plurality of endpoints, and wherein at least some of the plurality of endpoints terminate near at least one corresponding sequential element of the plurality of sequential elements.

20. The system of claim 19, wherein the instructions further comprise instructions to impose a design constraint that one or more of the H-trees correspond to the clusters having sequential elements.

21. The system of claim 19, wherein the instructions further comprise instructions to impose a design constraint that one or more of the H trees, in conjunction with one or more conducting layers above the H-trees, couple the sequential elements of corresponding clusters to one or more associated one-shot pulse generators such that the coupled sequential elements emulate flip-flop functionality as observed by the ad hoc circuit design.

22. A non-transitory computer readable medium having stored thereon, computer-executable instructions configured to cause a computing apparatus, in response to execution of the instructions by the computing apparatus, to perform a plurality of operations comprising:
generating an ad hoc circuit design defining, at least in part and in conjunction with a base array of function blocks, a functionality of a structured ASIC-based integrated circuit, wherein the function blocks are organized into clusters of one or more of the function blocks, wherein at least some of the clusters include a plurality of sequential elements and one or more H-trees respectively over one or more of the clusters, wherein at least one H-tree of the one or more H-trees have a plurality of endpoints, and wherein at least some of the plurality of endpoints terminate near at least one corresponding sequential element of the plurality of sequential elements.

23. The non-transitory computer-readable medium of claim 22, wherein the computer-executable instructions, if executed by the computing apparatus, further cause the computing apparatus to perform an operation of imposing a design constraint that one or more of the H-trees correspond to the clusters having sequential elements.

24. The non-transitory computer-readable medium of claim 22, wherein the computer-executable instructions, if executed by the computing apparatus, further cause the computing apparatus to perform an operation of imposing a design constraint that one or more of the H-trees, in conjunction with one or more conducting layers above the H-trees, couple the sequential elements of corresponding clusters to one or more associated one-shot pulse generators such that the coupled sequential elements emulate flip-flop functionality as observed by the ad hoc circuit design.

* * * * *

UNITED STATES PATENT AND TRADEMARK OFFICE
CERTIFICATE OF CORRECTION

PATENT NO. : 8,176,458 B2  Page 1 of 1
APPLICATION NO. : 12/325629
DATED : May 8, 2012
INVENTOR(S) : Galbi et al.

It is certified that error appears in the above-identified patent and that said Letters Patent is hereby corrected as shown below:

On Title Page 2, Item (56), under "OTHER PUBLICATIONS", Line 19, delete "Figure" and insert -- Figures --, therefor.

Figure 7:
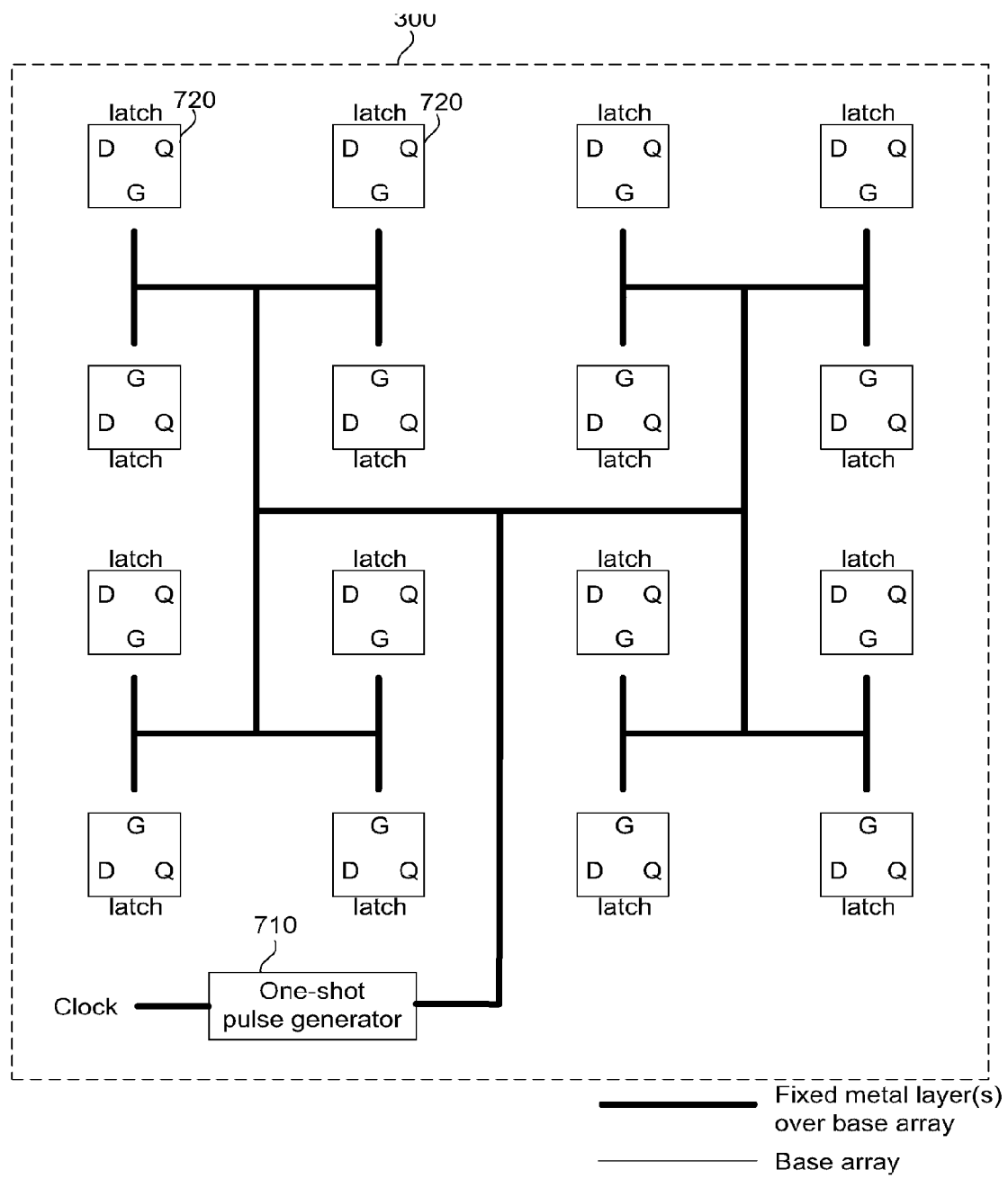
FIG. 7 is a functional block diagram of an H-tree using a one-shot pulse generator in accordance with yet another embodiment.

In Fig. 7, Sheet 8 of 9, delete " 3UU " and insert -- 300 --, therefor.

In Column 1, Lines 17-19, delete "which are hereby incorporated by reference which are hereby incorporated by reference in their" and insert -- which are hereby incorporated by reference in their --, therefor.

In Column 1, Line 57, delete "on semiconductor" and insert -- on a semiconductor --, therefor.

In Column 2, Line 39, delete "circuitry." and insert -- circuitry --, therefor.

In Column 4, Line 13, delete "invention 8 is" and insert -- invention is --, therefor.

In Column 4, Line 59, delete "bc" and insert -- be --, therefor.

In Column 5, Line 48, delete "summary" and insert -- summarize --, therefor.

In Column 12, Line 7, delete "light," and insert -- right, --, therefor.

In Column 12, Line 31, delete "3101" and insert -- 310 in --, therefor.

In Column 16, Line 43, in Claim 12, delete "forming, b a computing" and insert -- forming, by a computing apparatus, in an integrated circuit, --, therefor.

In Column 17, Line 27, in Claim 21, delete "H trees," and insert -- H-trees, --, therefor.

Signed and Sealed this
Thirty-first Day of July, 2012

David J. Kappos
*Director of the United States Patent and Trademark Office*